(12) United States Patent
Suzuki

(10) Patent No.: US 6,862,078 B2
(45) Date of Patent: Mar. 1, 2005

(54) PROJECTION OPTICAL SYSTEM AND EXPOSURE APPARATUS WITH THE SAME

(75) Inventor: Takeshi Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/029,210

(22) Filed: Dec. 28, 2001

(65) Prior Publication Data

US 2002/0167650 A1 Nov. 14, 2002

(30) Foreign Application Priority Data

Feb. 21, 2001 (JP) .................................... P2001-044760

(51) Int. Cl.$^7$ .......................... G03B 27/54; G03B 27/42
(52) U.S. Cl. .......................................... 355/67; 355/53
(58) Field of Search ............................... 355/53, 67–71; 359/649–651, 350, 364, 727–735; 510/53

(56) References Cited

U.S. PATENT DOCUMENTS

| | | | |
|---|---|---|---|
| 4,948,238 A | 8/1990 | Araki et al. | |
| 5,260,832 A | 11/1993 | Togino et al. | |
| 5,636,000 A | 6/1997 | Ushida et al. | |
| 5,781,278 A | 7/1998 | Matsuzawa et al. | |
| 5,805,344 A | 9/1998 | Sasaya et al. | |
| 5,808,814 A | 9/1998 | Kudo | |
| 5,831,770 A | 11/1998 | Matsuzawa et al. | |
| 5,831,776 A | 11/1998 | Sasaya et al. | |
| 5,835,285 A | 11/1998 | Matsuzawa et al. | |
| 5,852,490 A | 12/1998 | Matsuyama | |
| 5,856,884 A | 1/1999 | Mercado | |
| 5,903,400 A | 5/1999 | Endo | |
| 5,943,172 A | 8/1999 | Sasaya et al. | |
| 5,956,182 A | 9/1999 | Takahashi | |
| 5,990,926 A | 11/1999 | Mercado | |
| 6,008,884 A | 12/1999 | Yamaguchi et al. | |
| 6,084,723 A | 7/2000 | Matsuzawa et al. | |
| 6,088,171 A | 7/2000 | Kudo | |
| 6,104,544 A | 8/2000 | Matsuzawa et al. | |
| 6,198,576 B1 | 3/2001 | Matsuyama | |
| 6,259,508 B1 | 7/2001 | Shigematsu | |
| 6,333,781 B1 | 12/2001 | Shigematsu | |
| 6,349,005 B1 | 2/2002 | Schuster et al. | |
| 6,373,554 B1 | 4/2002 | Jinbo et al. | ................... 355/67 |
| 6,496,306 B1 * | 12/2002 | Shafer et al. | ............... 359/355 |
| 6,560,031 B1 | 5/2003 | Shafer et al. | |
| 6,674,513 B2 | 1/2004 | Omura | |
| 2001/0012099 A1 | 8/2001 | Kumagai | |
| 2002/0005938 A1 | 1/2002 | Omura | |
| 2003/0063394 A1 | 4/2003 | Suzuki et al. | |

FOREIGN PATENT DOCUMENTS

| | | |
|---|---|---|
| EP | 0 875 778 A1 | 11/1998 |
| EP | 1 001 314 A2 | 5/2000 |
| EP | 1 006 373 A2 | 6/2000 |

(List continued on next page.)

Primary Examiner—Henry Hung Nguyen
(74) Attorney, Agent, or Firm—Oliff & Berridge PLC

(57) ABSTRACT

A projection optical system projects an image of a first surface onto a second surface, and has a lens component formed of fluorite and a lens component formed of silica, and further includes: a first lens group including at least one lens component formed of fluorite and having a positive refractive power; a second lens group which is arranged in an optical path between the first lens group and the second surface and which has a negative refractive power; and a third lens group which is arranged in an optical path between the second lens group and the second surface and having a positive refractive power; wherein when the number of the lens components formed of silica is Snum, the number of the lens components formed of fluorite is Cnum, and a numerical aperture of the second surface side of the projection optical system is NA, the following conditions are satisfied:

Snum>Cnum     (1)

NA>0.75     (2).

21 Claims, 5 Drawing Sheets

FOREIGN PATENT DOCUMENTS

| | | |
|---|---|---|
| EP | 1 006 387 A2 | 6/2000 |
| EP | 1 006 388 A2 | 6/2000 |
| EP | 1 037 267 A1 | 9/2000 |
| EP | 1 061 396 A2 | 12/2000 |
| EP | 1 094 350 A2 | 4/2001 |
| EP | 1 111 425 A2 | 6/2001 |
| EP | 1 139 138 A1 | 10/2001 |
| EP | 1 164 399 A2 | 12/2001 |
| JP | A-5-34593 | 2/1993 |
| JP | A-5-173065 | 7/1993 |
| JP | A-6-313845 | 11/1994 |
| JP | A-7-128592 | 5/1995 |
| JP | A-8-305034 | 11/1996 |
| JP | A-10-79345 | 3/1998 |
| JP | A-10-197791 | 7/1998 |
| JP | A-10-325922 | 12/1998 |
| JP | A-10-333030 | 12/1998 |
| JP | A-11-95095 | 4/1999 |
| JP | A-11-133301 | 5/1999 |
| JP | A-11-297612 | 10/1999 |
| JP | A-11-297620 | 10/1999 |
| JP | A-11-352398 | 12/1999 |
| JP | P2000-56218 A | 2/2000 |
| JP | P2000-56219 A | 2/2000 |
| JP | P2000-121933 A | 4/2000 |
| JP | P2000-121934 A | 4/2000 |
| JP | P2000-131607 A | 5/2000 |
| JP | P2000-133588 A | 5/2000 |
| JP | P2000-137162 A | 5/2000 |
| JP | P2000-182952 A | 6/2000 |
| JP | P2000-199850 A | 7/2000 |
| JP | P2000-231058 A | 8/2000 |
| JP | P2000-249917 A | 9/2000 |
| JP | P2000-356741 A | 12/2000 |
| JP | P2000-357645 A | 12/2000 |
| JP | P2001-23887 A | 1/2001 |
| JP | P2001-51193 A | 2/2001 |
| WO | WO 00/33138 | 6/2000 |
| WO | WO 00/70407 | 11/2000 |
| WO | WO 01/50171 | 7/2001 |

* cited by examiner

PROJECTION OPTICAL SYSTEM AND EXPOSURE APPARATUS WITH THE SAME

BACKGROUND OF THE INVENTION

1. Field of the Invention

This invention relates to a projection optical system which projects an image of a first plane onto a second plane, and particularly, a projection optical system which is suitable for reduction-projection-exposing a semiconductor pattern which is formed on a reticle (mask) at a first plane onto a substrate (wafer) at a second plane, and an exposure apparatus provided with the projection optical system.

2. Background of the Related Art

When a semiconductor element is fabricated, a projection exposure apparatus is used which transfers an image of a pattern on a reticle onto a wafer coated by a resist via a projection optical system. As miniaturization of patterns of semiconductor integrated circuits to be transferred has progressed, high resolution is demanded for a projection optical system which is used for wafer exposure. In order to meet the demand, it is necessary to proceed with procedures such as shortening the wavelength of an exposure light or increasing the numerical aperture of a projection lens optical system.

Recently, in order to respond to miniaturization of transfer patterns, KrF excimer laser (wavelength 248 nm) has begun to be used instead of an i line (wavelength 365 nm) as an exposure light source. Furthermore, ArF excimer laser (wavelength 193 nm) has also begun to be used.

Recently, particularly with respect to ArF excimer laser, narrowing of the band region of a laser light source has progressed by using optical elements. However, a half width of approximately several pm still remains. If this type of light source is used as a light source of a projection optical system in which most of the structural glass material is silica, chromatic aberration, which cannot be ignored, is generated. As a result, image contrast deteriorates, causing image deterioration.

Therefore, narrowing of the band region of a laser is desired, but narrowing the band region of a laser is not easy, and has limitations because there are many problems such as deterioration of a narrow band region element over time. Therefore, by adding other glass types to the structural lens, the chromatic aberration can be corrected. Fluorite is used for the other glass type. Fluorite can also control irradiation fluctuation in addition to chromatic aberration. If a laser in which narrowing of the band region cannot very much further proceed is used as a light source, and an optical system is structured by using fluorite, the majority of the structural members of the optical system also have to be fluorite. However, in addition to the high cost of fluorite, it is known that a performance capability of an optical system with fluorite deteriorates because processability is poor, and surface changes due to temperature fluctuation are significant.

SUMMARY OF THE INVENTION

Thus, an object of this invention is to correct chromatic aberration and control irradiation fluctuation while design performance capability is maintained even when a laser light source is used which has not been well developed with respect to a narrow band region.

In order to accomplish the above-mentioned object, a projection optical system according to one aspect of this invention is a projection optical system which projects an image of a first plane onto a second plane. The projection optical system, includes:

a lens component formed of fluorite;

a lens component formed of silica;

a first lens group including at least one lens component formed of fluorite and having a positive refractive power;

a second lens group arranged in an optical path between the first lens group and the second surface and having a negative refractive power; and a third lens group arranged in an optical path between the second lens group and the second surface and having a positive refractive power;

wherein when the number of the lens components formed of silica is Snum, the number of the lens components formed of fluorite is Cnum, and a numerical aperture of the second surface side of the projection optical system is NA, the following conditions are satisfied:

$$Snum > Cnum \quad (1)$$

$$NA > 0.75 \quad (2).$$

DETAILED DESCRIPTION OF PREFERRED EMBODIMENTS

Figure 1:
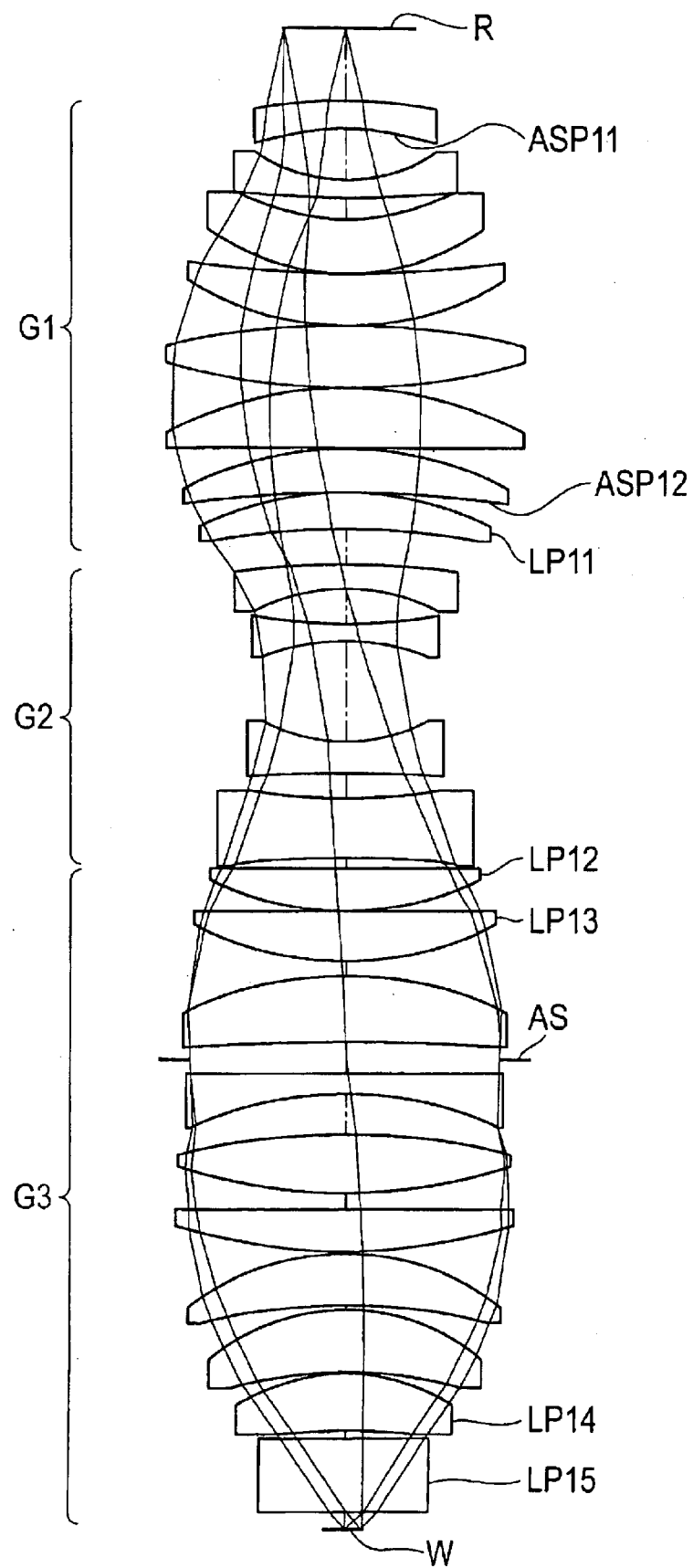
FIG. 1 is an optical path diagram of a projection optical system of a first embodiment of this invention.

In a projection optical system according to the above-mentioned aspect of the invention, a first lens group having a positive refractive power relays a telecentric light beam emitted from a first surface to a second lens group. At the same time, positive distortion is generated in advance, and by so doing, negative distortion generated in the second and third lens groups is corrected. Furthermore, the second lens group, having a negative refractive power, mainly contributes to the correction of Petzval's sum and accomplishes flatness of the image plane. The third lens group, having a positive refractive power, telecentrically projects an image of a light beam relayed from the second lens group onto the second plane, and mainly plays a role of imaging in a state in which generation of spherical aberration is controlled as much as possible.

With respect to silica glass material for ArF laser, it is known that irradiation fluctuation such as absorption, compaction, or the like is generated. Here, by using at least one lens of a fluorite glass material for the first lens group having a positive refractive power, aberration deterioration of irradiation fluctuation due to silica glass material can be controlled. In the first lens group, a light beam (partial aperture) going through a center of an optical axis is relatively distant on a lens surface from a light beam going through a peripheral area, so when irradiation fluctuation is generated in the first lens group, the difference between the peripheral area and the center of a projection area or the like becomes significant, and aberration fluctuation becomes large. Thus, by using fluorite for the first lens group, aberration deterioration due to irradiation fluctuation can be effectively controlled.

Condition (1) establishes the necessary number of fluorite elements for a structure of a projection optical system according to the above-mentioned aspect of the invention. By using the structure of the projection optical system of this invention, the number of lenses can be reduced, the entire optical system can be made smaller, and axial chromatic aberration can be made proportionally small. Therefore, chromatic aberration can be reduced, so the number of fluorite members can be reduced, and in the projection optical system according to the above-mentioned condition, a design performance capability can be maintained in the same manner as in a conventional projection optical system.

Condition (2) establishes a numerical aperture which can be accomplished by the structure of the projection optical system according to the above-mentioned aspect of the invention. As the entire optical system is made smaller, a refractive power of a third lens group having a positive refractive power becomes strong, and the projection optical system with the high numerical aperture of condition (2) can be accomplished. At that time, in order to further miniaturize the optical system while maintaining various aberrations, it is preferable that at least one aspherical surface is provided within the second lens group having a negative refractive power. Furthermore, when the minimum of condition (2) is exceeded, power of the third lens group is weakened, the entire projection optical system becomes larger, and chromatic aberration becomes poor in proportion.

In the projection optical system according to the above-mentioned condition, it is preferable that at least one lens component among lens components formed of the fluorite within the first lens group has a positive refractive power. As described above, with respect to the structure of the first lens group, effects of abenation deterioration due to irradiation fluctuations in the first lens group, such as coma, the difference between the periphery and the center in the projection area, or the like are larger than such effects in other lens groups. In particular, in a positive lens, with respect to an optical path length going through a glass material, a light beam going though at the optical axis center is longer than a light beam going through the periphery; therefore, effects of irradiation fluctuation on a glass material are easily generated. Thus, from the standpoint of efficiently controlling aberration fluctuation due to irradiation fluctuation, it is preferable that a fluorite glass material is used for lenses having a positive refractive power. Additionally, from a perspective of chromatic aberration correcting occurring due to the difference in the refractive index of fluorite, it is preferable that a fluorite glass material is used for lenses having a positive refractive power.

Furthermore, in the projection optical system according to the above-mentioned aspect, it is preferable that the third lens group has at least one lens component formed of fluorite. A light beam which is diverged by the second lens group is converged by the third lens group, so each lens of the third lens group has a high irradiating energy density. This causes compaction, which is a type of irradiation fluctuation. If a fluorite glass material is used for the third lens group, an effect can be obtained which reduces the effect of this compaction. Furthermore, if a fluorite glass material is used for a glass material with thickness close to the point at which the irradiating energy density is focused, compaction can be further effectively corrected.

In the projection optical system according to the above-mentioned condition, when the distance between the first surface and the second surface is L, the distance between the first surface and the lens surface of the first lens group closest to the second surface side is L1, and the focal length of the second lens group is f2, it is preferable that the following conditions are satisfied:

$$0.2 < L1/L < 0.5 \quad (3)$$

$$0.03 < -f2/L < 0.10 \quad (4)$$

Condition (3) establishes an appropriate positive refractive power of the first lens group for the entire system. If the maximum value of condition (3) is exceeded, negative distortion generated in the second lens group cannot be corrected. If the minimum value of condition (3) is exceeded, it is not good because positive distortion of a higher order is generated.

Condition (4) establishes an appropriate negative refractive power of the second lens group for the entire system. If the maximum value of condition (4) is exceeded, correction of Petzval's sum becomes insufficient, and deterioration of flatness of an image plane occurs. If the minimum value of condition (4) is exceeded, spherical aberration of a high order is generated, and image contrast deteriorates.

In the projection optical system in the above-mentioned aspect, it is preferable that the first lens group has at least one aspherical lens surface. Because of this, distortion can be corrected even further.

In the projection optical system in the above-mentioned aspect, the lens group which constitutes the projection optical system can also be constituted by the first, second, and third lens groups only.

In the projection optical system in the above-mentioned aspect, the projection optical system can also be structured so as to be optimized with respect to light having a center wavelength of 200 nm or less.

The following explains details of embodiments of this invention based on the drawings. Additionally, with respect to structural elements having the same function and structure, repetitive explanation is omitted in the following explanation and the drawings use the same symbols.

(First Embodiment)

FIG. 1 is a diagram showing a lens structure of a projection optical system according to a first embodiment of this invention. The projection optical system of this embodiment uses silica $SiO_2$ and fluorite $CaF_2$ as a glass material and telecentrically projects an image of a reticle R at a first surface onto a wafer W at a second surface. This projection optical system is constituted by, in order from the reticle R side, a first lens group G1 having a positive refractive power, a second lens group G2 having a negative refractive power, and a third lens group G3 having a positive refractive power. The first lens group G1 includes a lens LP11 having a positive refractive power formed of fluorite in addition to ASP11 and ASP12 which are aspherical-shaped lens surfaces. The third lens group G3 includes lenses LP12, LP13, LP14, and LP15 formed of fluorite. An aperture stop AS is arranged within the third lens group G3, and a reference wavelength of this projection optical system is 193.3 nm.

Various values of the projection optical system according to the first embodiment are shown in Table 1. Furthermore, aspherical coefficients of the respective aspherical surfaces are shown in Table 2. With respect to an aspherical surface, when height in a direction perpendicular to the optical axis is y, distance (sag amount) along the optical axis from a tangent plane at a vertex of the aspherical surface to a position on the aspherical surface at height y is Z, a radius of curvature at the vertex is r, a conical coefficient is K, and aspherical coefficients of an n order are A–F, the following equation can be expressed:

$$Z = (y^2/r)/\left[1 + \{1 - (1+K) \cdot y^2/r^2\}^{1/2}\right] + A*y^4 + B*y^6 + C*y^8 + D*y^{10} + E*y^{12} + F*y^{14}$$

Here, mm can be used as one example of the units for the radius of curvature and surface interval in various values of this embodiment. The following shows an index of refraction of each glass material at the wavelength of 193.3 nm.

$Sio_2$ 1.5603261
$CaF_2$ 1.5014548

TABLE 1

| Surface Number | Radius of Curvature | Surface Interval | Glass Material |
|---|---|---|---|
|  |  | 56.57 |  |
| 1 | 388.465 | 23.27 | $SiO_2$ |
| 2 | 177.000 | 42.53 |  |
| 3 | −120.028 | 15.00 | $SiO_2$ |
| 4 | −752.332 | 16.54 |  |
| 5 | −193.722 | 44.12 | $SiO_2$ |
| 6 | −192.988 | 1.00 |  |
| 7 | −799.710 | 42.35 | $SiO_2$ |
| 8 | −240.979 | 1.00 |  |
| 9 | 666.130 | 51.12 | $SiO_2$ |
| 10 | −543.380 | 1.00 |  |
| 11 | 299.996 | 49.64 | $SiO_2$ |
| 12 | INFINITY | 1.00 |  |
| 13 | 276.988 | 35.60 | $SiO_2$ |
| 14 | 991.456 | 1.00 |  |
| 15 | 252.935 | 30.34 | $CaF_2$ |
| 16 | 574.560 | 30.59 |  |
| 17 | 687.760 | 19.37 | $SiO_2$ |
| 18 | 143.863 | 30.27 |  |
| 19 | 399.976 | 15.00 | $SiO_2$ |
| 20 | 170.000 | 87.67 |  |
| 21 | −128.314 | 26.18 | $SiO_2$ |
| 22 | 804.730 | 21.59 |  |
| 23 | −570.040 | 51.47 | $SiO_2$ |
| 24 | 950.000 | 10.24 |  |
| 25 | INIFNITY | 35.89 | $CaF_2$ |
| 26 | −250.424 | 1.02 |  |
| 27 | INIFNITY | 41.69 | $CaF_2$ |
| 28 | −262.449 | 13.09 |  |
| 29 | 290.060 | 56.21 | $SiO_2$ |
| 30 | 1757.000 | 26.96 |  |
| 31 | INIFNITY | 15.03 | $SiO_2$ |
| 32 | 276.988 | 34.69 |  |
| 33 | 533.910 | 48.23 | $SiO_2$ |
| 34 | −471.548 | 15.61 |  |
| 35 | INIFNITY | 32.96 | $SiO_2$ |
| 36 | −490.708 | 2.60 |  |
| 37 | 199.138 | 42.55 | $SiO_2$ |
| 38 | 439.306 | 3.65 |  |
| 39 | 170.020 | 49.30 | $SiO_2$ |

TABLE 1-continued

| Surface Number | Radius of Curvature | Surface Interval | Glass Material |
|---|---|---|---|
| 40 | 300.000 | 1.66 |  |
| 41 | 154.428 | 45.93 | $CaF_2$ |
| 42 | 522.270 | 5.77 |  |
| 43 | INIFNITY | 60.00 | $CaF_2$ |
| 44 | 1687.460 | 11.35 |  |

TABLE 2

Aspherical Coefficients

Surface 2

K: 0.000000
A: −.106010E−06    B: 0.204228E−11    C: −.588237E−16
D: 0.112269E−20

Surface 14

K: 0.000000
A: 0.417491E−08    B: 0.514111E−13    C: −.666592E−18
D: 0.141913E−22

Surface 20

K: 0.000000
A: 0.166854E−07    B: 0.370389E−12    C: −.138273E−16
D: −.304113E−20
24 surfaces K: 0.000000
A: 0.361963E−07    B: −.679214E−12   C: −.128267E−16
D: 0.908964E−21    E: −.121007E−25

Surface 40

K: 0.000000
A: −.179608E−07    B: 0.149941E−12    C: −.128914E−17
D: −.506694E−21    E: 0.204017E−25    F: −.730011E−30

The following shows the condition corresponding values.
Snum=17, Cnum=5
NA=0.78
L=1248.653
L 1=412.086
f 2=−45.108
L 1/L=0.330
−f 2/L=0.036

Figure 2:
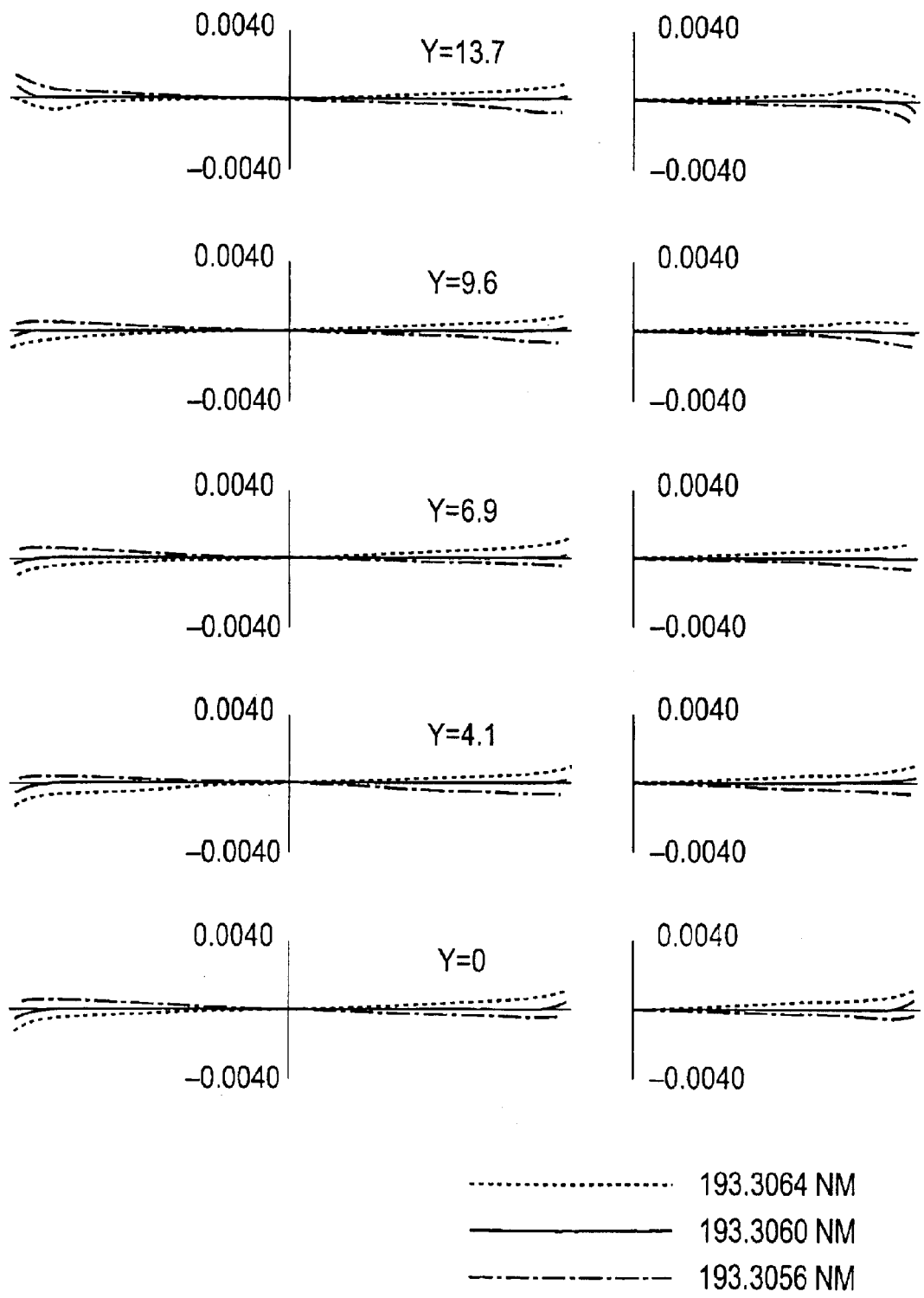
FIG. 2 shows aberration diagrams of a projection optical system of the first embodiment of this invention.

FIG. 2 shows horizontal aberration (coma) in a tangential direction and in a sagittal direction of a projection optical system of this embodiment. In the diagram, Y represents the image height, and the maximum image height in the projection optical system of this embodiment is 13.7. In the diagram, solid lines show aberration at a wavelength of 193.3060 nm, dotted lines show aberration at the wavelength of 193.3064 nm, and single-dot chain lines show aberration at the wavelength of 193.3056 nm, respectively. As is clear from the aberration diagrams, with respect to the projection optical system of this embodiment, chromatic aberration can be corrected well within the range of the image height 0 to the maximum image height 13.7.

(Second Embodiment)

Figure 3:
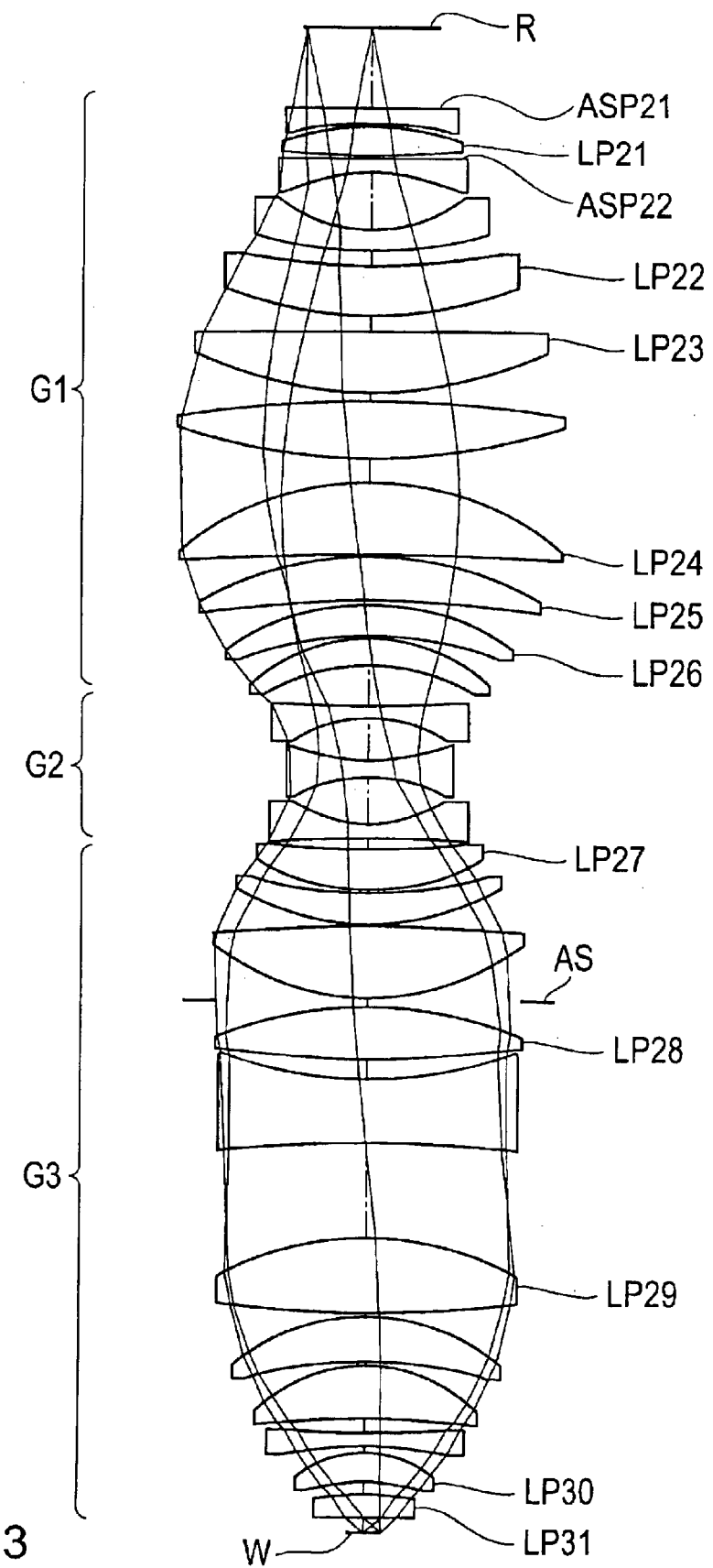
FIG. 3 is an optical path diagram of a projection optical system of a second embodiment of this invention.

FIG. 3 is a diagram showing a lens structure of a projection optical system according to a second embodiment of this invention. The projection optical system of this embodiment uses silica $SiO_2$ and fluorite $CaF_2$ as a glass material and telecentrically projects an image of a reticle R at a first surface onto a wafer W at a second surface. This projection optical system is constituted by, in order from the reticle R side, a first lens group G1 having a positive refractive power, a second lens group G2 having a negative refractive power, and a third lens group G3 having a positive refractive power. The first lens group G1 includes lenses P21, LP22, LP23, LP24, LP25, and LP26 having a positive refractive power formed of fluorite in addition to ASP21 and ASP22 which are aspherical lens surface. The third lens group G3 includes lenses LP27, LP28, LP29, LP30, and LP31 formed of fluorite. An aperture stop AS is arranged within the third lens group G3. The reference wavelength of this projection optical system is 193.3 nm.

Various values of the projection optical system according to the second embodiment are shown in Table 3. Furthermore, aspherical coefficients of the respective aspherical surfaces are shown in Table 4. The definition of the aspherical coefficients is the same as in the above-mentioned equation. Here, mm can be used as one example for the units of the radius of curvature and surface interval in various values of this embodiment.

TABLE 3

| Surface Number | Radius of Curvature | Surface Interval | Glass Material |
| --- | --- | --- | --- |
|  |  | 68.91 |  |
| 1 | ∞ | 12.52 | SiO$_2$ |
| 2 | 396.770 | 3.00 |  |
| 3 | 254.008 | 24.42 | CaF$_2$ |
| 4 | −934.473 | 3.00 |  |
| 5 | −12906.162 | 12.00 | SiO$_2$ |
| 6 | 155.270 | 48.71 |  |
| 7 | −138.969 | 19.68 | SiO$_2$ |
| 8 | −365.690 | 12.17 |  |
| 9 | −721.284 | 42.56 | CaF$_2$ |
| 10 | −372.350 | 14.41 |  |
| 11 | 8373.957 | 52.39 | CaF$_2$ |
| 12 | −354.413 | 8.35 |  |
| 13 | 1031.713 | 49.83 | SiO$_2$ |
| 14 | −549.575 | 21.26 |  |
| 15 | 249.361 | 64.78 | CaF$_2$ |
| 16 | 1823.143 | 3.00 |  |
| 17 | 291.668 | 38.62 | CaF$_2$ |
| 18 | 811.496 | 3.72 |  |
| 19 | 211.542 | 26.55 | CaF$_2$ |
| 20 | 282.982 | 3.52 |  |
| 21 | 150.387 | 23.88 | SiO$_2$ |
| 22 | 168.182 | 36.14 |  |
| 23 | −3641.124 | 12.00 | SiO$_2$ |
| 24 | 125.009 | 38.28 |  |
| 25 | −156.902 | 14.19 | SiO$_2$ |
| 26 | 123.218 | 43.61 |  |
| 27 | −116.259 | 12.95 | SiO$_2$ |
| 28 | 1233.016 | 10.60 |  |
| 29 | −813.248 | 37.67 | CaF$_2$ |
| 30 | −193.265 | 3.00 |  |
| 31 | −368.334 | 26.36 | SiO$_2$ |
| 32 | −224.645 | 3.01 |  |
| 33 | 1410.985 | 63.02 | SiO$_2$ |
| 34 | −218.896 | 4.24 |  |
| 35 | INIFNITY | 4.18 |  |
| 36 | 326.130 | 46.86 | CaF$_2$ |
| 37 | −1078.234 | 17.43 |  |
| 38 | −378.423 | 57.18 | SiO$_2$ |
| 39 | 1092.919 | 84.29 |  |
| 40 | 265.072 | 64.79 | CaF$_2$ |
| 41 | −1076.165 | 3.15 |  |
| 42 | 175.673 | 39.40 | SiO$_2$ |
| 43 | 389.870 | 3.07 |  |
| 44 | 132.696 | 44.00 | SiO$_2$ |
| 45 | 558.221 | 12.33 |  |
| 46 | −1378.349 | 12.26 | SiO$_2$ |
| 47 | 409.951 | 6.01 |  |
| 48 | 96.901 | 24.21 | CaF$_2$ |
| 49 | 164.260 | 11.54 |  |
| 50 | 333.758 | 18.07 | CaF$_2$ |
| 51 | 2155.618 | 12.21 |  |

TABLE 4

Aspherical coefficients

Surface 2

K: 0.000000
A: 0.377826E−07   B: 0.1834493E−11   C: −.861369E−16
D: −.310456E−20

Surface 6

K: 0.000000
A: −.119582E−06   B: 0.572777E−12   C: 0.253461E−16
D: −174207E−20

Surface 26

K: 0.000000
A: 0.101023E−06   B: −.116323E−10   C: −.588509E−15
D: 0.298472E−19

Surface 47

K: 0.000000
A: 0.435107E−07   B: −.237192E−11   C: −.246845E−15
D: 0.156567E−19

The following shows the condition corresponding values.

Snum=14, Cnum=11

NA=0.8

L=1323.330

L1=557.251 f2=−40.547

L1/L=0.421

−f2/L=0.031

Figure 4:
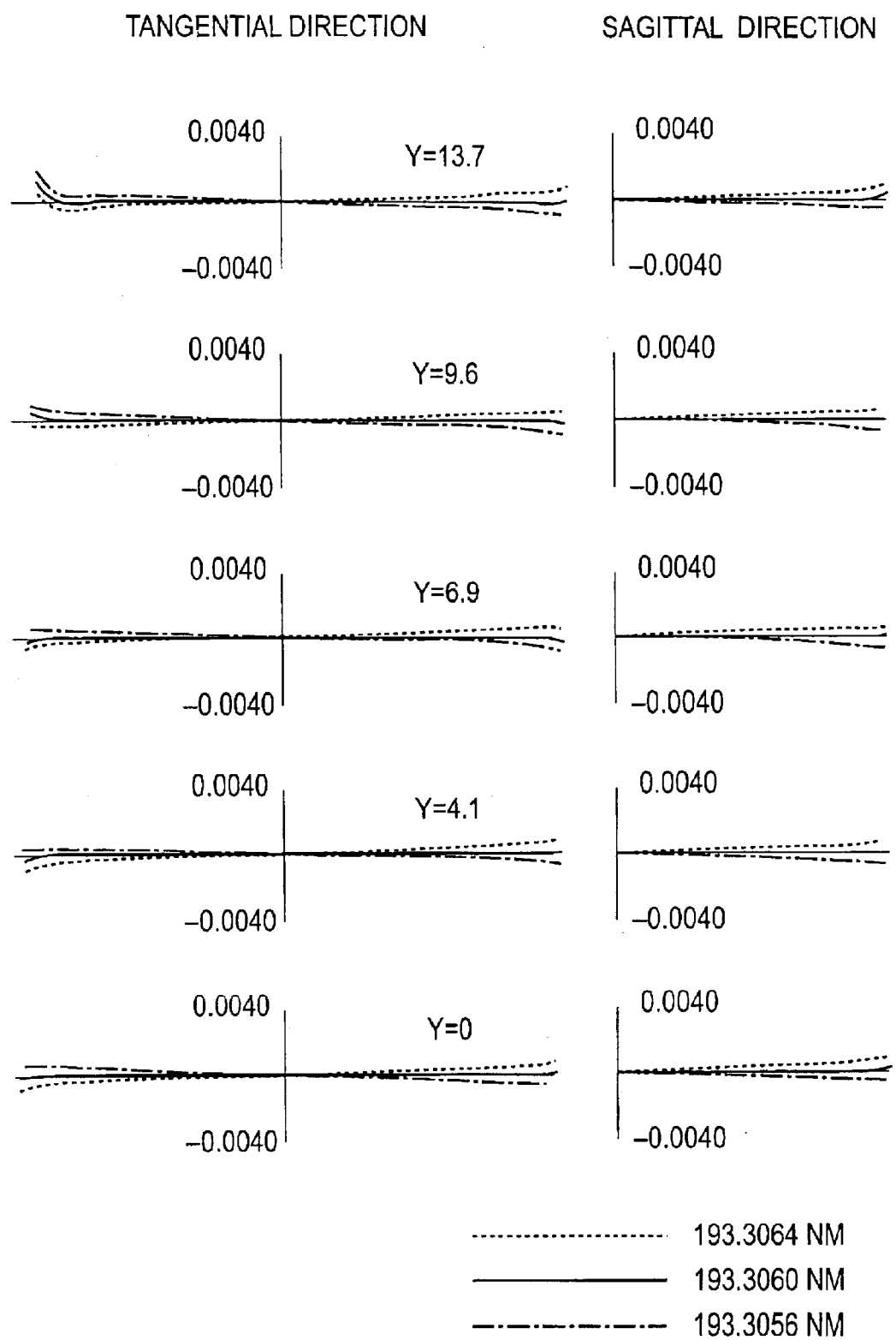
FIG. 4 shows aberration diagrams of a projection optical system of the second embodiment of this invention.

FIG. 4 shows horizontal aberration (coma) in a tangential direction and in a sagittal direction of a projection optical system of this embodiment. In the diagram, Y represents the image height, and the maximum image height in the projection optical system of this embodiment is 13.7. In the diagram, solid lines show aberration at a wavelength of 193.3060 nm, broken lines show aberration at the wavelength of 193.3064 nm, and single-dot chain lines show aberration at the wavelength of 193.3056 nm, respectively. As is clear from the aberration diagrams, chromatic aberration of the projection optical system of this embodiment is corrected well within the range of the image height 0 to the maximum image height 13.7.

Figure 5:
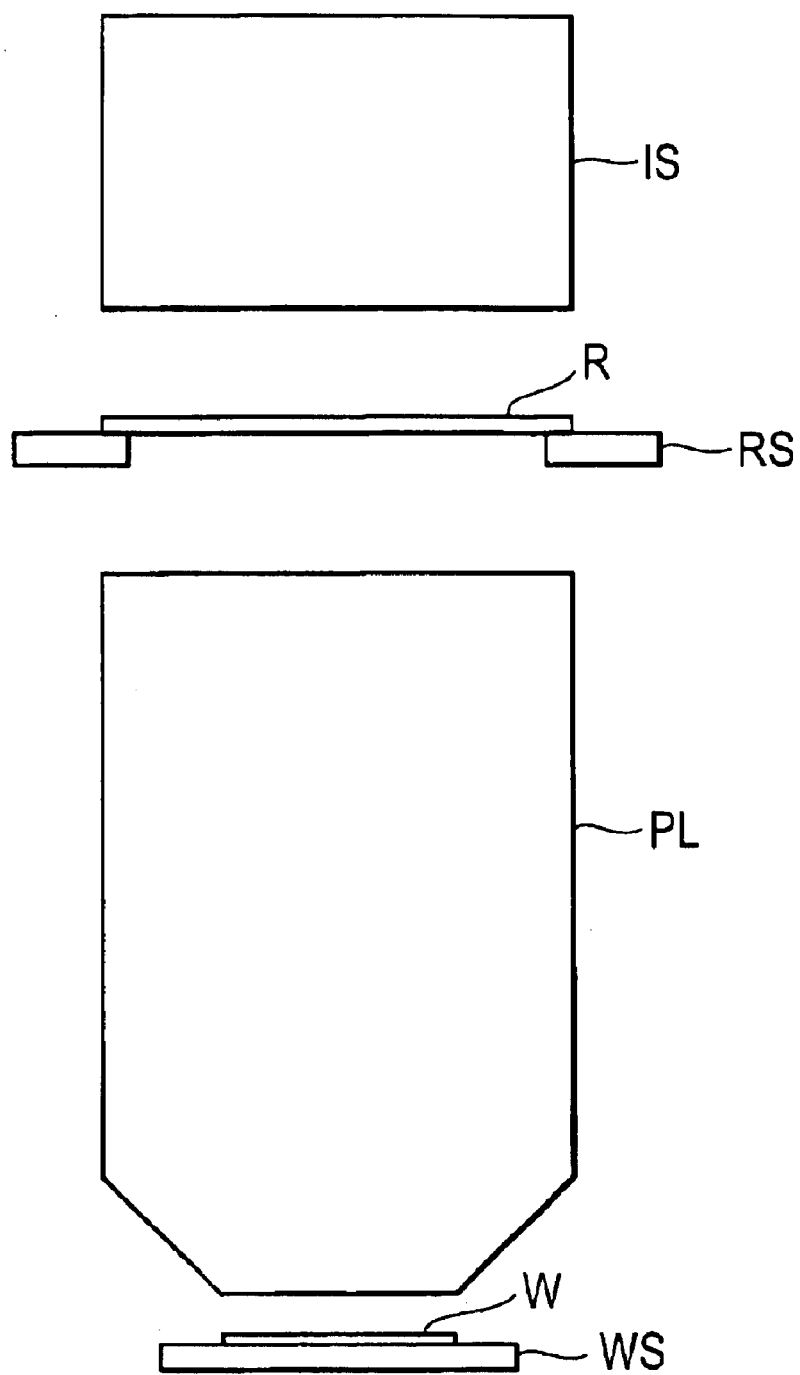
FIG. 5 is a structural diagram of a projection exposure apparatus related to embodiments of this invention.

FIG. 5 is a structural diagram of a projection exposure apparatus to which the projection optical system of the first or second embodiments is applied as a projection optical system PL. A mask (a reticle R) in which a predetermined pattern is formed is arranged on the reticle R surface of the projection optical system PL. A wafer W coated by a photoresist is arranged, as a workpiece, at the wafer W surface of the projection optical system PL. The reticle R is held on a reticle stage RS, and the wafer W is held on a wafer stage WS. Above the reticle R, an illumination optical system IS is arranged which includes the exposure light source and uniformly illuminates the reticle R. Here, ArF laser is used as the exposure light source.

Exposure light supplied from the light source substantially uniformly illuminates the reticle R via an (undepicted) optical system within the illumination optical system IS. In the optical system within the illumination optical system IS may also be included, for example, a fly's eye lens and/or an internal surface reflective type integrator which uniformizes the irradiation distribution of exposure light, an optical integrator which forms a planar light source of a predetermined size and shape, a variable field stop (reticle blind) which regulates the size and shape of the illumination region on the reticle R, and/or an optical system such as a field stop imaging optical system which projects an image of the field stop onto the reticle. An image of the pattern of the reticle R which has been illuminated is reduced by the projection magnification via the projection optical system PL, exposed and transferred onto the wafer W.

Preferred embodiments of this invention were explained with reference to the attached drawings. However, this invention is not limited to the above-mentioned examples. It is clear that one of ordinary skill of the art can reach various modifications and changes within the technical field as set forth in the scope of the claims. It is also understood that such modifications are also part of the scope of the claims of this invention.

For example, an example using ArF laser as a light source was explained in the above-mentioned example, but this invention is not limited to this.

Thus, in the projection optical system of the above-mentioned embodiments as explained in detail, even when a laser light source whose band region has not been narrowed very much is used, or when a fluorite glass material is not used to the maximum extent, correction of chromatic aberration and control of irradiation changes can be suitably performed while design performance capability is maintained. Furthermore, in the projection exposure apparatus of the above-mentioned embodiments, a fine circuit pattern can be formed at high resolution by using an exposure light source having a short wavelength.

We claim:

1. A projection optical system which projects an image of a first surface onto a second surface, and which has a lens component formed of fluorite and a lens component formed of silica, comprising:

a first lens group including at least one lens component formed of fluorite and having a positive refractive power;

a second lens group which is arranged in an optical path between the first lens group and the second surface and which has a negative refractive power; and a third lens group which is arranged in an optical path between the second lens group and the second surface and having a positive refractive power;

wherein the projection optical system has no reflective surfaces in the optical path between the first surface and the second surface; and wherein when the number of the lens components formed of silica is Snum, the number of the lens components formed of fluorite is Cnum, and a numerical aperture of the second surface side of the projection optical system is NA, the following conditions are satisfied:

$$Snum > Cnum \quad (1)$$

$$NA > 0.75 \quad (2).$$

2. The projection optical system as set forth in claim 1, wherein at least one lens component among the lens components formed of fluorite in the first lens group has a positive refractive power.

3. The projection optical system as set forth in claim 2, wherein the third lens group has at least one lens component formed of fluorite.

4. The projection optical system as set forth in claim 3, wherein when the distance between the first surface and the second surface is L, the distance between the first surface and the lens surface of the first lens group closest to the second surface side is L1, and the focal length of the second lens group is f2, the following conditions are satisfied:

$$0.2 < L1/L < 0.5$$

$$0.03 < -f2/L < 0.10.$$

5. The projection optical system as set forth in claim 4, wherein the first lens group has at least one aspherical lens surface.

6. The projection optical system as set forth in claim 5, wherein the lens groups which form the projection optical system are the first, second and third lens groups only.

7. The projection optical system as set forth in claim 6, wherein the projection optical system is optimized with respect to light having a center wavelength of 200 nm or less.

8. The projection optical system as set forth in claim 2, wherein when the distance between the first surface and the second surface is L, the distance between the first surface and the lens surface of the first lens group closest to the second surface side is L1, and the focal length of the second lens group is f2, the following conditions are satisfied:

$$0.2 < L1/L < 0.5$$

$$0.03 < -f2/L < 0.10.$$

9. The projection optical system as set forth in claim 2, wherein the first lens group has at least one aspherical lens surface.

10. The projection optical system as set forth in claim 2, wherein the lens groups which form the projection optical system are the first, second, and third lens groups only.

11. The projection optical system as set forth in claim 2, wherein the projection optical system is optimized with respect to light having a center wavelength of 200 nm or less.

12. The projection optical system as set forth in claim 1, wherein the third lens group has at least one lens component formed of fluorite.

13. The projection optical system as set forth in claim 1, wherein when the distance between the first surface and the second surface is L, the distance between the first surface and the lens surface of the first lens group closest to the second surface side is L1, and the focal length of the second lens group is f2, the following conditions are satisfied:

$$0.2 < L1/L < 0.5$$

$$0.03 < -f2/L < 0.10.$$

14. The projection optical system as set forth in claim 1, wherein the first lens group has at least one aspherical lens surface.

15. The projection optical system as set forth in claim 1, wherein the lens groups which form the projection optical system are the first, second, and third lens groups only.

16. The projection optical system as set forth in claim 1, wherein the projection optical system is optimized with respect to light having a center wavelength of 200 nm or less.

17. A projection exposure apparatus which projects and exposes a reduced image of a pattern arranged in a mask onto a workpiece, comprising:

a light source having a center wavelength of 200 nm or less;

an illumination optical system which guides exposure light from the light source to the pattern on the mask; and the projection optical system as set forth in claim 1; wherein the mask can be arranged at the first surface, and the workpiece can be arranged at the second surface.

18. A projection exposure apparatus which projects and exposes a reduced image of a pattern arranged in a mask onto a workpiece, comprising:

a light source having a center wavelength of 200 nm or less;

an illumination optical system which guides exposure light from the light source to the pattern on the mask; and the projection optical system as set forth in claim 2;

wherein the mask can be arranged at the first surface, and the workpiece can be arranged at the second surface.

19. A projection exposure method which projects and exposes a reduced image of a pattern arranged in a mask onto a workpiece, comprising the steps of: supplying exposure light having a center wavelength of 200 nm or less;

guiding the exposure light to the pattern on the mask; and projecting an image of the pattern on the mask arranged at the first surface onto the workpiece arranged at the second surface by using the projection optical system as set forth in claim 1.

20. A projection exposure method which projects and exposes a reduced image of a pattern arranged in a mask onto a workpiece, comprising the steps of:

supplying exposure light having a center wavelength of 200 nm or less;

guiding the exposure light to the pattern on the mask; and projecting an image of the pattern on the mask arranged at the first surface onto the workpiece arranged at the second surface by using the projection optical system as set forth in claim 2.

21. A projection optical system which projects an image of a first surface onto a second surface, and which has a lens component formed of fluorite and a lens component formed of silica, comprising:

a first lens group including at least one lens component formed of fluorite and having a positive refractive power;

a second lens group which is arranged in an optical path between the first lens group and the second surface and which has a negative refractive power; and a third lens group which is arranged in an optical path between the second lens group and the second surface and having a positive refractive power;

wherein when the number of the lens components formed of silica is Snum, the number of the lens components formed of fluorite is Cnum, a numerical aperture of the second surface side of the projection optical system is NA, the distance between the first surface and the second surface is L, the distance between the first surface and the lens surface of the first lens group closest to the second surface side is L1, and the focal length of the second lens group is f2, the following conditions are satisfied:

$Snum > Cnum$ $NA > 0.75.$ $0.2 < L1/L < 0.5$ $0.03 < -f2/L < 0.10.$

* * * * *